United States Patent [19]
Schiebel et al.

[11] Patent Number: 5,534,719
[45] Date of Patent: Jul. 9, 1996

[54] HGCDTE THIN FILM TRANSISTOR

[75] Inventors: Richard A. Schiebel; Michael A. Kinch; Roland J. Koestner, all of Dallas, Tex.

[73] Assignee: Texas Instruments Incorporated, Dallas, Tex.

[21] Appl. No.: 379,065

[22] Filed: Jan. 27, 1995

Related U.S. Application Data

[62] Division of Ser. No. 151,722, Nov. 15, 1993, Pat. No. 5,403,760, which is a division of Ser. No. 598,282, Oct. 16, 1990, abandoned.

[51] Int. Cl.$^6$ ................................................. H01L 31/0328
[52] U.S. Cl. ........................... 257/188; 257/78; 257/192; 257/201; 257/280
[58] Field of Search ........................... 257/78, 188, 192, 257/201, 280, 410, 471, 614

[56] References Cited

U.S. PATENT DOCUMENTS 4,575,920  3/1986  Tsunashima ........................... 257/412

OTHER PUBLICATIONS

Electronics Letters, vol. 16, No. 22, pp. 839–840, Oct. 23, 1980, by Williams et al. "n–channel M.I.S.F.E.T.S in epitaxial HgCdTe/CdTe".

*Primary Examiner*—Mark V. Prenty
*Attorney, Agent, or Firm*—John D. Crane; James C. Kesterson; Richard L. Donaldson

[57] ABSTRACT

Group II–VI thin film transistors, a method of making same and a monolithic device containing a detector array as well as transistors coupled thereto wherein, according to a first embodiment, there is provided a group II–VI insulating substrate, a doped layer of a group II–VI semiconductor material disposed over the substrate, an insulating gate region disposed over the doped layer, a pair of spaced contacts on the doped layer providing source and drain contacts, a gate contact disposed over the insulating gate region, an insulating layer disposed over exposed regions of the substrate, doped layer, insulating gate region and contacts and metallization disposed on the insulating layer and extending through the insulating layer to the contacts. The thickness of the doped layer is less than the maximum depletion region thickness thereof. In accordance with a second embodiment, there is provided a group II–VI insulating substrate, a first conductive doped group II–VI semiconductor layer disposed over the substrate, a second doped group II–VI layer disposed over the first layer and forming a Schottky barrier therewith, an insulating layer disposed over exposed regions of the substrate, first doped layer and second doped layer and metallization disposed on the insulating layer and extending through the insulating layer to spaced regions on the first layer to form source and drain contacts thereto and to the second layer to form a gate contact thereto. The thickness of said first layer is less than the maximum depth of the depletion region formed by the junction of the first and second layers.

19 Claims, 1 Drawing Sheet

HGCDTE THIN FILM TRANSISTOR

This is a division, of application Ser. No. 0/151,722, filed Nov. 15, 1993 now U.S. Pat. No. 5,403,760, which is a division of Ser. No. 07/598,282, filed Oct. 16, 1990 now abandoned.

BACKGROUND OF THE INVENTION

1. FIELD OF THE INVENTION

This invention relates to group II–VI thin film transistors, a method of making same and a monolithic device containing a detector array as well as transistors coupled thereto.

2. BRIEF DESCRIPTION OF THE PRIOR ART

Infrared focal plane arrays presently fabricated on group II–VI compounds, particularly HgCdTe, require electrical signals to be input and output from the focal plane array. Output signals require some form of signal processing (i.e. amplification, buffering, etc.). Input signals provide clocking or power supply to the various elements of the array.

While such infrared focal plane arrays are presently realized in group II–VI compounds, functions such as signal processing and clocking are performed almost exclusively in silicon. While incorporation of circuits into the group II–VI material itself along with the focal plane array has many advantages, such as increased array responsivity, fewer leads to the focal plane array, etc., this concept to date has been realized to only a limited extent.

Though many types of transistor structures have been demonstrated in group II–VI compound materials, they are not compatible with all-(or necessarily any) detector structure and, in addition, many have limitations resulting from the small band gap of the material in which they are fabricated.

One approach that has been taken to alleviate the above described problem of the prior art has been to fabricate appropriate circuitry on silicon and bond these circuits to the HgCdTe focal plane array. In bonding the silicon to the HgCdTe, a significant stray capacitance is introduced, substantially diminishing the output signal from the focal plane array and necessitating additional amplifier circuits in the silicon. To minimize the stray capacitance, the silicon circuits are located in close proximity to the HgCdTe array, usually on the focal plane itself. This is an additional weakness since it increases power dissipation in the focal plane array.

Another approach is to incorporate some signal processing functions into the HgCdTe itself using MISFET circuitry. This significantly reduces stray capacitance problems, but has several weaknesses as well. Circuitry of any complexity will require the connection of the source or drain of one FET to the gate of another. Since the source and drain regions of MISFETs are formed by ion implanted diodes, the operating voltages of gates are constrained to the range between the forward turn-on voltage of the diode and its reverse breakdown voltage. Since the reverse breakdown is less than one volt on long wavelength HgCdTe, this represents a severe limitation. In many cases the fixed charge density at the HgCdTe insulator/interface does not permit operation in this range.

In addition, MISFETs can only be fabricated on p-type HgCdTe since a device compatible method of producing p-type regions on n-type HgCdTe has not been demonstrated.

Several transistor types have been demonstrated in the literature on group II–VI materials and all but one rely upon HgCdTe for the conduction channel. These various transistor architectures invariably impose constraints on film thickness, conductivity type and band gap that are at odds with detector requirements.

All transistors require CdTe or mid-to-wide band gap HgCdTe for optimum performance. This is at odds with long wavelength detection, requiring narrow band gap HgCdTe. As referenced in an article of A. Kolodny et al., IEEE Trans. Electron Devices, ED-27, 591 (1980), MISFETs are practical only on p-type material. For many detectors, n-type HgCdTe is the material of choice. As referenced in an article of G. R. Chapman et al., U.S. Workshop on the Physics and Chemistry of Mercury Cadmium Telluride, Orlando, Fla. (1988), JFETs and as referenced in an article of D. L. Dreifus et al., Jour. Vac. Sci., U.S. Workshop on the Physics and Chemistry of Mercury Cadmium Telluride, San Diego, Calif. (1989), thin film transistors require thin films on insulating substrates. Yet two-color detectors require multiple conductive films of HgCdTe. For MISFETs, JFETs and thin film transistors to be practical for widespread use, many additional film layers must be grown, solely for the transistor-circuits, adding to the complexity and risk of the materials growth and device fabrication process.

As referenced in an article of T. Ashley et al., Electron. Lett., 22,611 (1986), bipolar junction transistors have also been demonstrated in HgCdTe, but not in a form that is of practical value to the fabrication of circuits.

As referenced in an article of D. L. Dreifus et al., Applied Physics Letters, 51, 931 (1987), MESFETS have been demonstrated in conductive CdTe. This is the only transistor type thus demonstrated in a group II–VI compound that is compatible with any detector type and not coupled to properties of HgCdTe layers.

SUMMARY OF THE INVENTION

The transistor structure described in accordance with the present invention is compatible with any detector grown on a group II–VI material, preferably a CdTe or CdZnTe substrate and further overcomes some of the limitations imposed by other types of transistor structures previously demonstrated on group II–VI materials.

In accordance with a first embodiment of the present invention, the above is accomplished by providing an insulating or semi-insulating substrate of a group II–VI material, preferably CdTe or CdZnTe, onto which is formed an island of group II–VI material of n or p-type, preferably HgCdTe. It should be understood that the term HgCdTe is used throughout the discussion herein to represent $Hg_xCd_{1-x}Te$ where "x" can be in the range from 0 to 1. Contacts are made at spaced ends of the island to form source and drain contacts. An insulating layer, preferably of a group II–VI material, preferably of CdTe is grown over a portion of the island with metallization thereover to form the gate. The thickness of the insulating layer is determined by the specific application (i.e., the specific function performed by the circuit and the operating characteristics of the specific array attached thereto). The minimum thickness is also determined by the state of the art of the epitaxy technique used. Typical values presently used for similar gates with ZnS are 400 to 2000 Angstroms. The metallization must be of sufficient thickness to achieve a conductivity that is much greater than that of the insulator thereunder. Since this is easy to achieve, almost any thickness that provides uniform coverage may be used. The metallization must also be sufficiently thick to not to be consumed when apertures are subsequently formed to connect that level to high metal levels. For aluminum, for example, 1200 Angstroms is sufficient. The MIS gate crosses the island, the source-drain current being controlled by the size of the depletion region under the gate. The structure then has an insulating layer, which is sufficiently thick to minimize the possibility of spurious conduction between metallization thereabove and therebelow, formed thereon, preferably by deposition of ZnS with apertures then being formed through this insulating layer such as, for example with a bromine-methanol etchant or by milling where appropriate, to the source and drain contacts and the gate metallization. The insulator thickness will depend upon the state of the art of the deposition technique. Usually at least 2000 Angstroms of ZnS is sufficient. Metal that makes ohmic contact to the source and drain region is then formed over the ZnS insulating layer and into the apertures to make appropriate contact to the source, drain and gate electrodes. The metal used will depend upon the conductivity type of the HgCdTe film. For p-type HgCdTe, tin is preferred whereas for n-type HgCdTe, tantalum and aluminum are preferred. To operate properly, the HgCdTe film thickness must be less than the maximum depletion region thickness or about 0.5 microns or less. Such films are preferably grown by molecular beam epitaxy (MBE).

A novel feature of this device is that it achieves transistor action using majority carriers on either n or p type HgCdTe without resorting to ion implantation and in a manner that provides for device isolation.

To fabricate the above described device, a thin sheet (about 0.5 micron or less) film or n or p type HgCdTe is grown on an insulating or semi-insulating substrate, such as, for example, CdTe or CdZnTe. A thin insulating film, such as CdTe, is then grown on top of the HgCdTe. Subsequent layers of HgCdTe, HgTe, CdTe or other materials such as are appropriate to the actual array performance and architecture may then be grown to form the detector array. The area in which circuits are to be fabricated is etched or milled down to the thin CdTe film. A subsequent delineation is performed to define the islands on which the individual transistors are to be fabricated by standard photoresist and etch techniques. At this point, an anodization or etch may be performed if it is necessary to passivate the sides of the HgCdTe islands. Metallization for gate and source/drain contacts are deposited in standard manner and a subsequent overlay insulator is deposited or evaporated over the entire structure. Vias are etched to gate, source and drain using a bromine-methanol etchant or by milling where appropriate and metallization to these contacts is evaporated or deposited in the vias along with buss lines. The buss lines are used to connect individual devices together to form circuits and to connect these circuits to the focal plane array.

A variation is to eliminate or etch through the thin CdTe film and use instead an anodization and ZnS as the gate insulator.

Advantages of the above described embodiment are that the device allows signal processing circuits to be fabricated on the same substrate as the array itself, eliminating stray capacitance problems. Output signals from the array are larger, thereby possibly eliminating the requirement for some amplifiers. Operating voltages for HgCdTe circuits are lower than for silicon, therefore less power is dissipated in the focal plane. Delineation provides effective device isolation, eliminating the conflicts between source/drain and gate operating voltages found in HgCdTe MISFET circuits. Ion implantation is unnecessary, eliminating a time consuming process step as well as the need for implanted junctions which are of questionable radiation hardness. This also makes possible the use of either n or p type HgCdTe. Since the HgCdTe film used for circuitry is or may be grown separately from the film or films used for infrared detection, it may have a large band gap, regardless of the band gap of the HgCdTe used in the detector array. This maximizes breakdown voltage and minimizes deleterious effects such as hot electron effects and noise, increasing the operating range and performance of these circuits. Use of a gate insulator grown in vacuum (CdTe) offers the potential for lower noise performance over conventionally used gate insulators such as anodizations and ZnS. No guard rings are necessary for device operation as is the case with HgCdTe MISFETs. This simplifies the fabrication process and greatly reduces fabrication time.

In accordance with a second embodiment of the invention, there is provided an insulating substrate of group II-VI material, preferably CdTe or CdZnTe having a thin layer of conductive n type CdTe thereon and a layer of conductive HgCdTe or HgTe thereover. These layers can be grown in the sequence discussed above, using MBE technology as is well known. The HgCdTe or HgTe layer is delineated to form a gate. This layer and the conductive CdTe layer are contacted through an overlying insulator using well known process steps. HgCdTe and HgTe form Schottky barriers with n type CdTe by virtue of their larger electron affinity.

The thickness of the n type CdTe layer is constrained to be less than the maximum depth of the depletion region formed by the HgCdTe or HgTe/CdTe junction. This is the only constraint on film thickness imposed by this structure. No constraints are imposed on films subsequently grown for detector structures. The use of the HgCdTe or HgTe/CdTe heterojunction as the gate is an important feature of this embodiment.

Advantages of the second embodiment are that it is totally decoupled from the detector structure. As a result, it is compatible with any type of HgCdTe-based detector. Also, the gate is grown rather than deposited. Use of a deposited gate requires the ability to etch through higher layers (used for detector structures) and stop precisely at the top of the conductive CdTe, to ensure uniform and predictable transistor characteristics. The MESFET structure is practical only if no subsequent layers are grown on top of the CdTe. The structure proposed herein allows growth of subsequent layers for detector structures. This embodiment requires only the addition of a conductive CdTe buffer layer to structures already made routinely. Ion implantation and additional gate levels, such as for guard rings, are unnecessary. Since the gate is grown rather than deposited, fewer defects will be present at the interface and the transistor will have lower noise than other transistor types, such as MISFETs, where the gate is deposited. This structure is also more radiation hard than other transistor structures.

DESCRIPTION OF THE PREFERRED EMBODIMENTS

Figure 1:
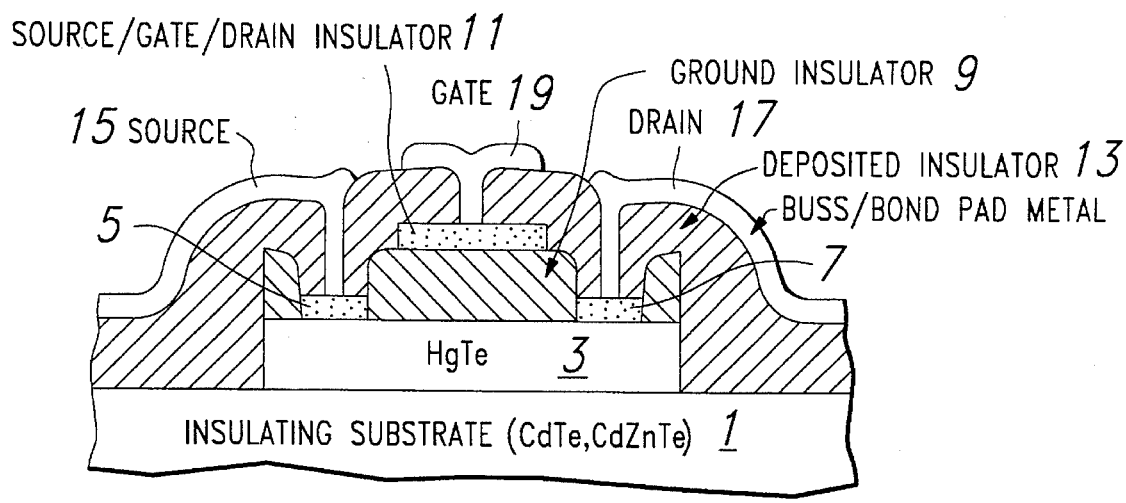
FIG. 1 is a cross-sectional view in accordance with a first embodiment of the present invention.

Referring first to FIG. 1, there is shown a cross sectional view of a transistor in accordance with the first embodiment of the present invention. It should initially be understood that several such transistors may be present on the same substrate though only one such transistor will be described. Also, a detector array may be present on the same substrate. The detector array would be separately fabricated by standard processing techniques which will not be described herein and would be coupled to the transistor(s) to be described herein by standard interconnecting metallization.

In accordance with the first embodiment of the invention, there is provided an insulating or semi-insulating substrate of a group II–VI material 1, preferably CdTe or CdZnTe onto which is formed an island 3 of group II–VI material of n or p-type, preferably HgCdTe. Contacts 5 and 7 are made at spaced ends of the island 3 to form source and drain contacts. An insulating layer 9, preferably of CdTe is grown over a portion of the island 3 with metallization 11 thereover to form the gate. The MIS gate crosses the island 3, the source-drain current being controlled by the size of the depletion region in the island portion under the gate. The structure then has an insulating layer 13 formed thereon, preferably by deposition of ZnS with apertures then being formed through this insulating layer to the source and drain contacts 5 and 7 and the gate metallization 11. Metallization 15 is then formed over the ZnS insulating layer 13 and into one of the apertures to make appropriate contact to the source. Similarly, metallization 17 and 19 make appropriate contact to the drain and gate electrodes respectively.

To operate properly, the HgCdTe film 3 thickness must be less than the maximum depletion region thickness or about 0.5 microns or less. Such films are preferably grown by molecular beam epitaxy (MBE).

To fabricate the above described device, a thin sheet (about 0.5 micron or less) film of n or p type HgCdTe is grown on an insulating or semi-insulating substrate 1, such as CdTe or CdZnTe after by MBE. A thin insulating film 9, such as CdTe is then grown over the HgCdTe by MBE. Subsequent layers of HgCdTe, HgTe, CdTe or other materials such as are appropriate to the actual focal plane array performance and architecture may then be grown, if appropriate. The area in which circuits are to be fabricated is etched or milled down to the thin CdTe film 9. A subsequent delineation is performed to define the islands on which the individual transistors are to be fabricated by appropriate masking and etching as is well known, only one such island being shown in FIG. 1.

At this point, an anodization or etch may be performed if it is necessary to passivate the sides of the HgCdTe islands 3. Metallization for gate 11 and source/drain 5, 7 contacts is deposited and a subsequent overlay insulator 13 of ZnS is deposited or evaporated in standard manner over the entire structure. Vias are etched through the insulator 13 to gate, source and drain contacts 11, 5 and 7 respectively and metallization 19, 15 and 17 respectively to the contacts 11, 5 and 7 respectively is evaporated or deposited into the vias to contact the respective contacts. Also buss lines can be deposited at the same time. The buss lines are used to connect individual devices together to form circuits and to connect these circuits to the focal plane array (not shown).

A variation is to eliminate or etch through the thin CdTe film 9 and use instead an anodization and ZnS as the gate insulator.

Figure 2:
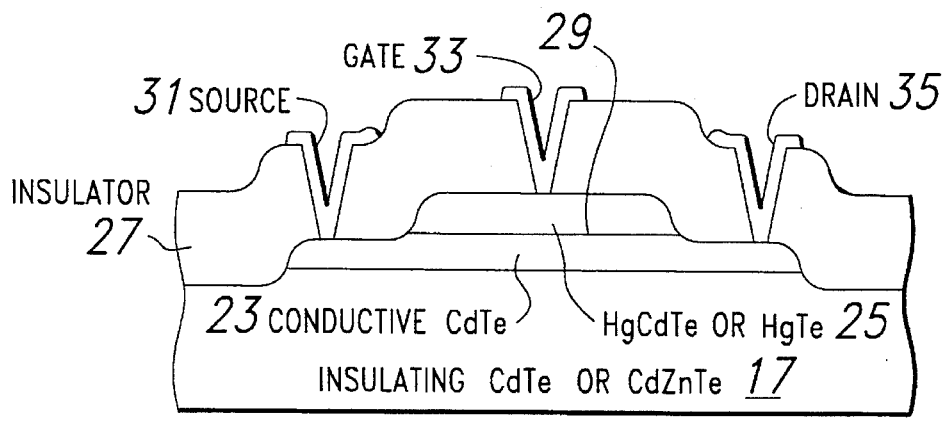
FIG. 2 is a cross sectional view in accordance with a second embodiment of the/present invention.

Referring now to FIG. 2 there is shown a cross sectional view of a transistor in accordance with a second embodiment of the invention. It should again be understood that several such transistors may be present on the same substrate though only one such transistor will be described. Also, a detector array may be present on the same substrate and connected to one or more of the transistors thereon. The detector array would be separately or simultaneously fabricated by standard processing techniques which will not be described herein and would be coupled to the transistor(s) to be described herein by standard interconnecting metallization.

The transistor includes an insulating substrate 21 of group II–VI material, preferably CdTe or CdZnTe having a thin layer 23 of conductive n type CdTe thereon which can be formed by doping during formation of the insulating layer 21. A layer 25 of HgCdTe or HgTe is formed over the layer 23 and forms a Schottky barrier therewith. These layers are grown in the sequence discussed above using MBE technology as is well known. Subsequent layers of HgCdTe, HgTe, CdTe or other materials such as are appropriate to the actual focal plane array performance and architecture may then be grown to form the array, if appropriate.

A delineation is performed to define the islands on which the individual transistors are to be fabricated if more than one transistor is to be formed by appropriate masking and etching as is well known, only one such island being shown in FIG. 2. An insulating layer 27, preferably of ZnS is then deposited over the entire structure. The layer 25 and the conductive CdTe layer 23 are contacted through the overlying insulator 27 using well known process steps by forming vias in the insulator 27 with subsequent metallization formed in the vias directly to the conductive layer 23 to form metallization to the source 31 and drain 35 and directly to the layer 25 to form metallization to the gate 33. HgCdTe and HgTe form Schottky barriers with n type CdTe by virtue of their larger electron affinity to provide the desired gate structure.

The thickness of the n type CdTe layer 23 is constrained to be less than the maximum depth of the depletion region formed by the HgCdTe or HgTe/CdTe junction 29. This is the only constraint on film thickness imposed by this structure. No constraints are imposed on films subsequently grown for detector structures. The use of the HgCdTe or HgTe/CdTe heterojunction as the gate is an important feature of this embodiment. As in the prior embodiment, the metallization 31, 33 and 35 can extend to other transistors and/or to the detector array on the substrate 21.

Figure 3:
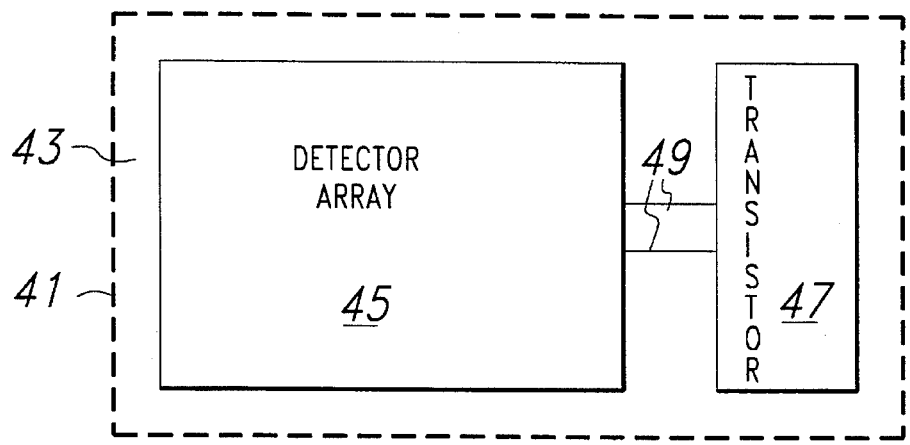
FIG. 3 is a schematic drawing of a monolithic device including a detector array and transistors with interconnects in accordance with the present invention.

It can be seen, as shown in FIG. 3, that there has been provided a monolithic device 41 in group II–VI insulating material 43 which contains both a detector array 45 as well as appropriate transistors 47 coupled thereto with appropriate interconnects 49 for operation therewith.

Though the invention has been described with respect to specific preferred embodiments thereof, many variations and modifications will immediately become apparent to those skilled in the art. It is therefore the intention that the appended claims be interpreted as broadly as possible in view of the prior art to include as such variations and modifications.

We claim:

1. A group II–VI thin film semiconductor device comprising:

(a) a group II–VI insulating substrate;

(b) a doped layer of a group II–VI semiconductor material disposed over said substrate, wherein the thickness of said doped layer is less than about 0.5 microns;

(c) an insulating gate region disposed over said doped layer;

(d) a pair of spaced contacts on said doped layer providing source and drain contacts;

(e) a gate contact disposed over said insulating gate region between and not contacting said spaced contacts;

(f) an insulating layer disposed over exposed regions of said substrate, said doped layer, said insulating gate region and said contacts; and (g) metallization disposed on said insulating layer and extending through said insulating layer to said contacts.

2. A device as set forth in claim 1 wherein said insulating gate region is of a group II–VI material.

3. A device as set forth in claim 1 wherein said doped layer is HgCdTe.

4. A device as set forth in claim 2 wherein said doped layer is HgCdTe.

5. A group II–VI thin film semiconductor device comprising:

(a) a group II–VI insulating substrate;

(b) a doped layer of a group II–VI semiconductor material disposed over said substrate;

(c) an insulating gate region disposed over said doped layer;

(d) a pair of spaced contacts on said doped layer providing source and drain contacts;

(e) a gate contact disposed over said insulating gate region;

(f) an insulating layer disposed over exposed regions of said substrate, said doped layer, said insulating flare region and said contacts; and (g) metallization disposed on said insulating layer and extending through said insulating layer to said contacts wherein said substrate is one of CdTe and CdZnTe, said insulating region is CdTe, said insulating layer is ZnS, and said doped layer is HgCdTe.

6. A device as set forth in claim 1 further including a detector array disposed on said substrate, said metallization coupling said array to at least one of said contacts.

7. A device as set forth in claim 4 further including a detector array disposed on said substrate, said metallization coupling said array to at least one of said contacts.

8. A device as set forth in claim 5 further including a detector array disposed on said substrate, said metallization coupling said array to at least one of said contacts.

9. A group II–VI thin film semiconductor device comprising:

(a) a group II–VI insulating substrate;

(b) a first conductive doped group II–VI semiconductor layer disposed over said substrate;

(c) a second doped group II–VI layer disposed over said first layer and forming a Schottky barrier therewith;

(d) an insulating layer disposed over exposed regions of said substrate, said first doped layer and said second doped layer; and (e) metallization disposed on said insulating layer and extending through said insulating layer to spaced regions on said first layer to form source and drain contacts thereto and to said second layer to form a gate contact thereto.

10. A device as set forth in claim 1 wherein the thickness of said first layer is less than 0.5 microns.

11. A device as set forth in claim 9 wherein said substrate is one of CdTe and CdZnTe.

12. A device as set forth in claim 9 wherein said first layer is CdTe.

13. A device as set forth in claim 11 wherein said first layer is CdTe.

14. A device as set forth in claim 9 wherein said second layer is one of HgCdTe and HgTe.

15. A device as set forth in claim 9 wherein said insulating layer is ZnS.

16. A device as set forth in claim 14 wherein said insulating layer is ZnS.

17. A device as set forth in claim 9, further including a detector array disposed on said substrate, said metallization coupling said array to at least one of said contacts.

18. A device as set forth in claim 14, further including a detector array disposed on said substrate, said metallization coupling said array to at least one of said contacts.

19. A device as set forth in claim 16, further including a detector array disposed on said substrate, said metallization coupling said array to at least one of said contacts.

* * * * *